US009570395B1

(12) United States Patent
Sengupta et al.

(10) Patent No.: US 9,570,395 B1
(45) Date of Patent: Feb. 14, 2017

(54) SEMICONDUCTOR DEVICE HAVING BURIED POWER RAIL

(71) Applicant: Samsung Electronics Co., Ltd., Suwon-si, Gyeonggi-do (KR)

(72) Inventors: Rwik Sengupta, Austin, TX (US); Joon Goo Hong, Austin, TX (US); Mark Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/158,500

(22) Filed: May 18, 2016

Related U.S. Application Data

(60) Provisional application No. 62/256,590, filed on Nov. 17, 2015.

(51) Int. Cl.
H01L 23/02 (2006.01)
H01L 23/528 (2006.01)
H01L 23/535 (2006.01)
H01L 29/78 (2006.01)
H01L 21/768 (2006.01)
H01L 23/532 (2006.01)
H01L 29/06 (2006.01)

(52) U.S. Cl.
CPC ..... *H01L 23/5286* (2013.01); *H01L 21/76802* (2013.01); *H01L 21/76877* (2013.01); *H01L 23/535* (2013.01); *H01L 23/53228* (2013.01); *H01L 23/53257* (2013.01); *H01L 29/0665* (2013.01); *H01L 29/785* (2013.01)

(58) Field of Classification Search
None
See application file for complete search history.

(56) References Cited

U.S. PATENT DOCUMENTS

| 6,785,877 | B1 | 8/2004 | Kozai | |
|---|---|---|---|---|
| 7,227,202 | B2 | 6/2007 | Kishishita | |
| 8,349,723 | B2 | 1/2013 | Filippi et al. | |
| 8,507,957 | B2 | 8/2013 | Hou et al. | |
| 8,618,607 | B1 * | 12/2013 | Rashed | H01L 27/0207 257/359 |
| 8,723,269 | B2 | 5/2014 | Rockett | |
| 9,105,466 | B2 | 8/2015 | Lu et al. | |
| 2009/0315079 | A1 * | 12/2009 | Tien | H01L 27/0207 257/207 |
| 2010/0078695 | A1 * | 4/2010 | Law | H01L 23/5223 257/296 |
| 2012/0280287 | A1 * | 11/2012 | Hou | H01L 27/0207 257/288 |
| 2013/0056808 | A1 * | 3/2013 | Tai | H01L 27/1463 257/292 |
| 2015/0084134 | A1 * | 3/2015 | Lin | H01L 21/823431 257/384 |
| 2015/0263039 | A1 * | 9/2015 | Singh | H01L 27/11807 257/206 |
| 2016/0020299 | A1 * | 1/2016 | Gregory | H01L 29/66757 438/299 |

(Continued)

*Primary Examiner* — Michael Lebentritt
(74) *Attorney, Agent, or Firm* — Lewis Roca Rothgerber Christie LLP

(57) ABSTRACT

A semiconductor device includes: a substrate; a power rail on the substrate; an active layer on the substrate and at same layer as the power rail; and a contact electrically connecting the power rail to the active layer. The active layer includes source/drain terminals.

20 Claims, 14 Drawing Sheets

(56) References Cited

U.S. PATENT DOCUMENTS

| | | | |
|---|---|---|---|
| 2016/0071848 A1* | 3/2016 | Sengupta | H01L 27/0886 257/401 |
| 2016/0078164 A1* | 3/2016 | Hsieh | G06F 17/5072 716/55 |
| 2016/0110489 A1* | 4/2016 | Schroeder | G06F 17/5072 716/119 |
| 2016/0111370 A1* | 4/2016 | Hsieh | H01L 23/535 257/401 |

* cited by examiner

SEMICONDUCTOR DEVICE HAVING BURIED POWER RAIL

CROSS-REFERENCE TO RELATED APPLICATION

This utility patent application claims priority to and the benefit of U.S. Provisional Patent Application Ser. No. 62/256,590, filed Nov. 17, 2015, entitled "BURIED POWER RAIL FOR ULTRA HIGH DENSITY STANDARD CELLS AND/OR IMPROVED PERFORMANCE STANDARD CELLS AND SYSTEM," the entire content of which is incorporated herein by reference.

BACKGROUND

1. Field

Aspects of exemplary embodiments of the present invention relate to a semiconductor device having a buried power rail.

2. Related Art

When forming a device including a plurality of semiconductor devices, such as integrated circuits, standard cells may be used as a base unit for designing and manufacturing the integrated circuits. The standard cell(s) may be used to form one or more functional circuits, and each standard cell may have the same footprint (e.g., may have a standard footprint). Using standard cells when designing complex circuits and components reduces design and manufacture costs.

In use, each standard cell of a device requires power input (Vdd) and ground (Vss) connections. To power the various components thereof, each standard cell is generally coupled to a power rail which is electrically connected to an active layer of the standard cell to provide the power (Vdd). In some instances, a plurality of power rails may be provided for each standard cell to respectively provide the power (Vdd) and the ground (Vss).

Furthermore, to provide the power to each power rail, a chip level power grid is included in the device. The chip level power grid may run through or between the various standard cells and is electrically connected to the power rails at various points along a length of the power rails.

Referring to FIG. 1, a standard cell 1 includes a power rail 10, contacts 30 (e.g., a contact layer), and a Via 20 (e.g., a tap). The Via 20 extends between and electrically connects the power rail 10 to the contacts 30, thereby providing power to the standard cell.

The standard cell 1 further includes an active layer 40 (e.g., fins or a nanosheet), including source/drain terminals (e.g., source/drain electrodes), and gate electrodes 50. While not shown, the active layer 40 is separated from a gate electrode by a gate insulation layer. As can be seen in FIG. 1, the power rail 10 is arranged above the contacts 30 and above the active layer 40.

Generally, a standard cell is designed having a stacked structure of various metal layers, termed M1-Mx, for example. The lowest metal layer is often termed M1 and is the first metal layer above an interconnection layer (e.g., a metal interconnection layer), sometimes termed M0.

The metal layers M1-Mx each include routing tracks, and various interconnections 12, 13 are formed in the routing tracks to connect various components of the standard cell to each other and to other standard cells. Generally, designs including a plurality of standard cells may include up to about eight metal layers M1-M8. However, semiconductor devices can be manufactured with more or fewer metals layers.

In FIG. 1, the power rail 10 of the standard cell 1 is arranged in a first metal layer M1, above the interconnection layer M0, in which the active layer 40 and the gate electrodes 50 are arranged. The interconnection layer M0 may be the first metal layer on a substrate and is electrically insulated from the first metal layer M1 by an insulating layer (e.g., an electrically insulating layer).

Due to the power rail 10 being arranged in a different layer than the active layer 40, the Via 20 is included. The Via 20 extends through the insulating layer between the first metal layer M1 and the interconnection layer M0 and electrically connects the power rail 10 to the contacts 30 and, thus, to the active layer 40.

FIG. 5 is a schematic side view of the standard cell 1 illustrated in FIG. 1. In FIG. 5, the interconnection layer M0 is indicated by 1000 and is where the contacts 30 and the active layer 40 are arranged. The first metal layer M1 is indicated by 1010 and is at which the power rails 10 and routing tracks 90 are arranged. As can be seen, the power rails 10 occupy the same level in the standard cell 1 as the routing tracks 90, thus reducing the space available for the routing tracks 90 in the standard cell 1.

Moreover, because the power rail 10 is included in one of the metal layers M1-Mx, the power rail 10 occupies space that could otherwise be used for routing tracks 90 and various interconnections. In addition, the power rail 10 is connected to the active layer 40 by the Via 20, and an IR drop across the Via 20 must be considered in designing a semiconductor device including the standard cell 1.

SUMMARY

The present disclosure is directed toward various embodiments of a semiconductor device including a buried power rail. In one embodiment, the semiconductor device includes a plurality of metal layers (e.g., metal routing layers) arranged above an interconnection layer on which an active layer and a power rail are arranged.

According to one embodiment, a semiconductor device includes: a substrate; a power rail on the substrate; an active layer on the substrate and at same layer as the power rail; and a contact electrically connecting the power rail to the active layer. The active layer including source/drain terminals.

The semiconductor device may further include a gate electrode at the same layer as the power rail.

A bottom surface of the power rail may be farther above the substrate than a bottom surface of the contact.

An upper surface of the power rail may be above an upper surface of the contact.

The semiconductor device may further include a plurality of metal layers, and each of the metal layers may include a plurality of interconnections. The power rail may be arranged below the plurality of metal layers.

One of the interconnections in the metal layer nearest to the substrate may be above the power rail in a direction perpendicular to an upper surface of the substrate.

At least one of the interconnections in each of the metal layers may extend over the power rail in a direction parallel to an upper surface of the substrate.

The contact and the power rail may be integrally formed.

A bottom surface of the power rail may be a same distance above the substrate as a bottom surface of the contact.

The power rail may include a low resistance metal.

According to another embodiment, a semiconductor device includes: a substrate; a power rail on the substrate; an active layer on the substrate and including source/drain terminals, a same number of layers being between the substrate and the power rail as between the substrate and the active layer; and a contact electrically connecting the power rail to the active layer.

The semiconductor device may further include a plurality of gate electrodes in the same layer as the power rail.

A bottom surface of the power rail may be farther from the substrate than a bottom surface of the contact.

The semiconductor device may further include a plurality of metal layers above the power rail, and each of the metal layers may include a plurality of interconnections.

At least one of the interconnections in a first one of the metal layers above the power rail may extend over the power rail in a direction perpendicular to an upper surface of the substrate.

At least one interconnection in each of the metal layers may extend over the power rail in a direction perpendicular to an upper surface of the substrate.

An imaginary line extending perpendicular to an upper surface of the substrate may extend through the power rail and at least one interconnection in a first one of the metal layers above the power rail.

The present disclosure is also directed toward various embodiments of methods of manufacturing a semiconductor device. In one embodiment, a method of manufacturing a semiconductor device includes: forming an active layer on a substrate; forming a plurality of contacts on the substrate; and forming a power rail on the substrate, the power rail being at a same level as the contacts. The contacts being electrically connected to the active layer, and the power rail being electrically coupled to the active layer by the contacts.

The method may further include forming an insulating layer on the active layer; forming a first trench in the insulating layer to define a first area; and forming a second trench in the insulating layer to define a second area. The forming of the power rail and forming the contact may include filling both the first and second areas in the insulating layer with a conductive material.

The method may further include patterning the substrate to form a trench at a cell separation boundary, and the forming of the power rail may include forming the power rail over the trench at the cell separation boundary.

This summary is provided to introduce a selection of features and concepts of exemplary embodiments of the present disclosure that are further described below in the detailed description. This summary is not intended to identify key or essential features of the claimed subject matter nor is it intended to be used in limiting the scope of the claimed subject matter. One or more of the described features may be combined with one or more other described features to provide a workable device.

DETAILED DESCRIPTION

Figure 1:
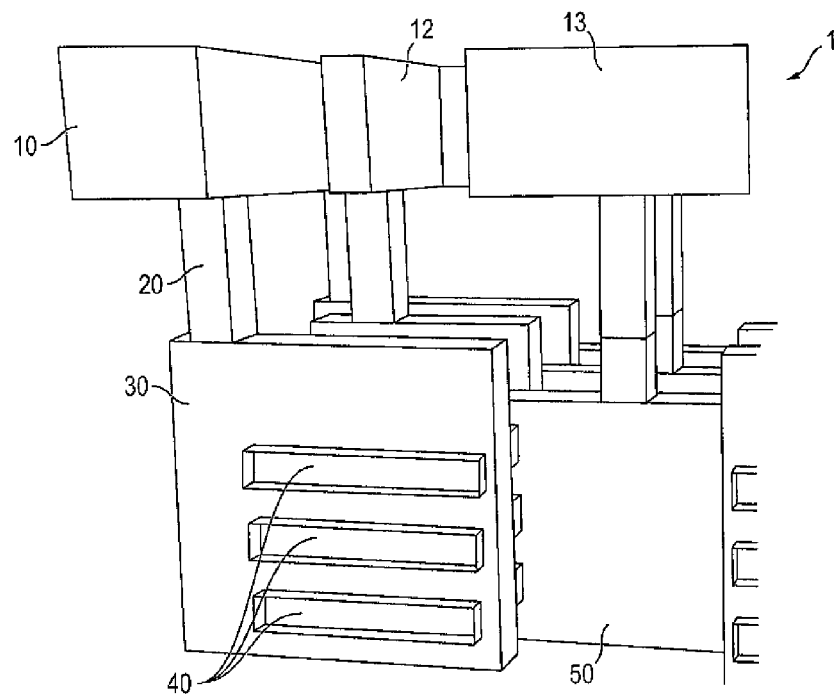
FIG. 1 is a perspective view of a portion of a standard cell.

The present disclosure is directed toward various exemplary embodiments of a semiconductor device including a buried power rail. In one embodiment, a semiconductor device includes a power rail at the same or substantially the same layer as an active layer of the semiconductor device, such as in an interconnection layer, and below metal layers M1-Mx (e.g., metal routing layers) thereof.

Accordingly, the semiconductor device can be manufactured without including Vias connecting the power rail to the active layer, thus reducing an IR drop caused by the Vias. In one embodiment, the number of routing tracks available in the metal layers M1-Mx for interconnections is increased, thus reducing place and route (PnR) congestion. In addition, cell height can be reduced. In other embodiments, cell height can be maintained but routing tracks can be widened, thus reducing wiring resistance and capacitance in the interconnections and improving design performance.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
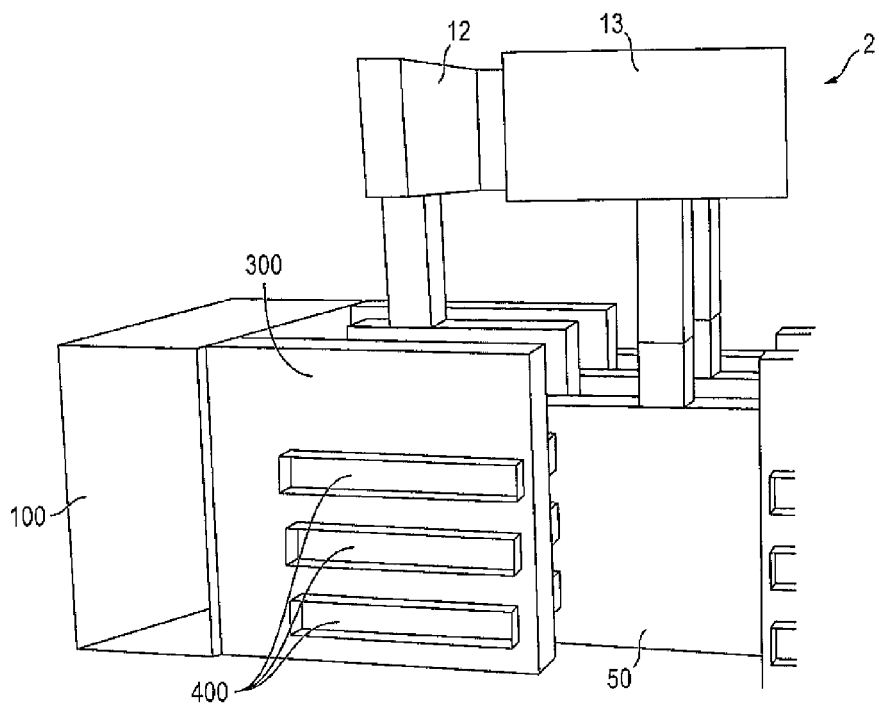
FIG. 2 is a perspective view of a portion of a standard cell according to an embodiment of the present invention.

FIG. 2 is a perspective view of a portion of a standard cell 2 according to an embodiment of the present invention. The standard cell 2 includes a power rail 100, contacts 300 (e.g., a contact layer), an active layer 400 (e.g., fins or a nanosheet) including source/drain terminals (e.g., source/drain electrodes), and gate electrodes 50. Although not shown, the gate electrodes 50 are separated from the active layer 400 by a gate insulation layer. The standard cell 2 may be, for example, an inverter.

In the standard cell 2, the power rail 100, the contacts 300, the active layer 400, and the gate electrodes 50 are each at an interconnection layer M0 (e.g., a metal interconnection layer). The interconnection layer M0 is below metal layers M1-Mx (e.g., metal routing layers) but is above the device connection layer. A cell level power grid may be in the upper metal layers, and the power rail 100 may be electrically connected to the cell level power grid at various points along its length at regular intervals, for example, every 10-20 microns, through standard via interconnections. In FIG. 2, various interconnections 12, 13 are illustrated above the power rail 100, the contacts 300, the active layer 400, and the gate electrodes 50, and the interconnections 12, 13 are at metal layer M1.

In the standard cell 2, the power rail 100 is adjacent to (e.g., directly adjacent to) the contacts 300 rather than being arranged in the metal layer M1 as illustrated in FIG. 1. For example, the power rail 100 is adjacent to the contacts 300 in a direction parallel to an upper surface of a substrate on which these components are arranged. By arranging the power rail 100 at the interconnection layer M0 adjacent to the contacts 300, the area in the metal layer M1 previously occupied by the power rail 10 (see FIG. 1) is now unoccupied. Thus, the area in the upper metal layers, such as the metal layers M1-Mx above the power rail 100, can be used for routing tracks and, thus, for signal interconnections (e.g., signal routing).

The power rail 100 is spaced from (e.g., spaced apart from) the gate electrodes 50 by a distance to reduce or prevent a short therebetween. For example, the power rail 100 is arranged to be spaced from the gate electrodes 50 in the direction parallel to the upper surface of the substrate to prevent a short occurring between the power rail 100 and the gate electrodes 50.

The power rail 100 may be directly electrically connected to the contacts 300. That is, rather than being connected to the contacts 300 through a Via as the power rail 10 is in the standard cell 1 illustrated in FIG. 1, the power rail 100 is directly connected to the contacts 300. Put another way, rather than the power rail 10 being indirectly electrically connected to the contacts 30 through a Via 20 (see FIG. 1), the power rail 100 is directly electrically connected to the contacts 300. As such, greater contact area exists between the power rail 100 and the contacts 300 than between the Via 20 and the contacts 30 (see FIG. 1). Thus, an IR drop between the power rail 100 and the contacts 300 can be reduced and improved DC FOM (e.g., higher Ieff) and/or AC FOM can be achieved due to lower parasitic resistance between the power rail 100 and the contacts 300. However, the present invention is not limited thereto, and an intermediate component may be present between and may electrically connect the power rail 100 to the contacts 300.

In addition, the power rail 100 is directly electrically connected to the contacts 300 along the entire or substantially the entire height of the contacts 300, thus further reducing any IR drop at the connection between the power rail 100 and the contacts 300. For example, rather than being limited by a Via (e.g., the Via 20 illustrated in FIG. 1), the power rail 100 has a relatively large contacts area with the contacts 300, thus reducing an IR drop at the connection therebetween when compared with a connection utilizing a Via.

Figure 4:
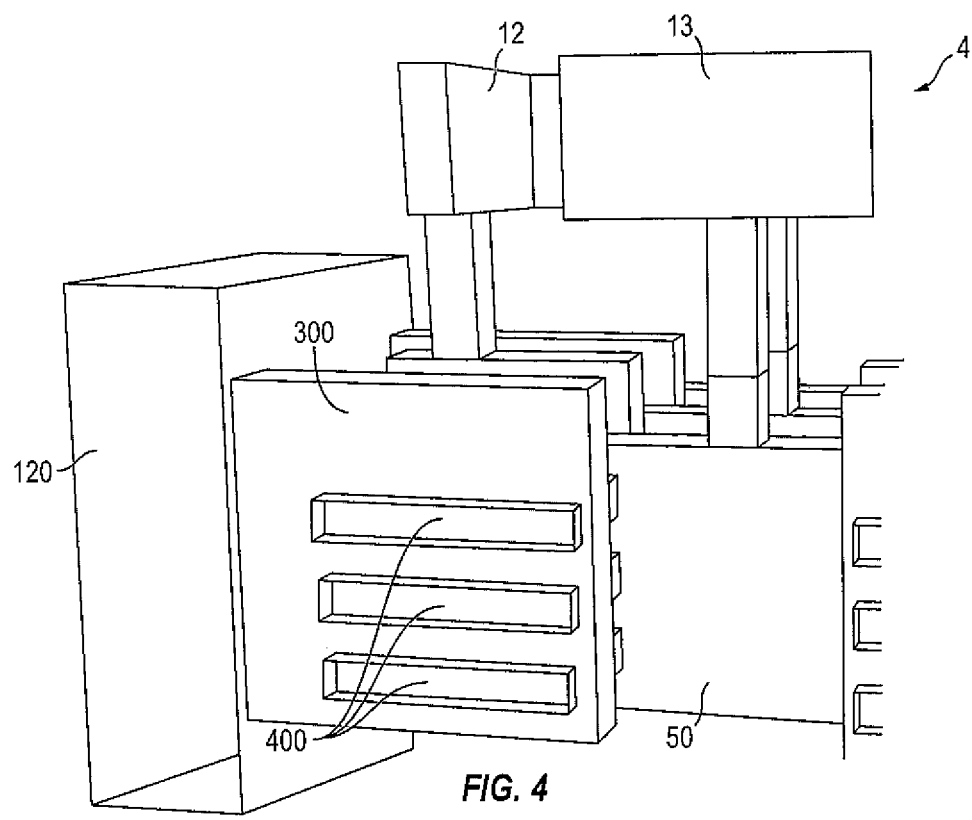
FIG. 4 is a perspective view of a portion of a standard cell according to another embodiment of the present invention.

By arranging the power rail 100 in the interconnection layer M0, the size of the power rail 100 can be increased compared to the power rail 10 (see FIG. 1) because the power rail 100 is not limited to the size of the routing tracks in the metal layer M1. For example, a height of the power rail 100 can be the same or substantially the same as the contacts 300. In another embodiment, as shown in FIG. 4, the height of a power rail 120 can be greater than the contacts 300. In addition, a width of the power rail 100 can be reduced compared to the power rail 10 (see FIG. 1) while containing the same amount of or a greater amount of conductive material than the power rail 10. By increasing the size of and, thus, increasing the amount of conductive material of the power rail 100, resistance of the power rail 100 is less than that of the power rail 10, reducing an IR drop compared to the standard cell 1. In addition, even when the width of the power rail 100 is reduced compared to the power rail 10, the overall size of the power rail 100 is greater than the power rail 10, thus ensuring the reduced IR drop.

Figure 3:
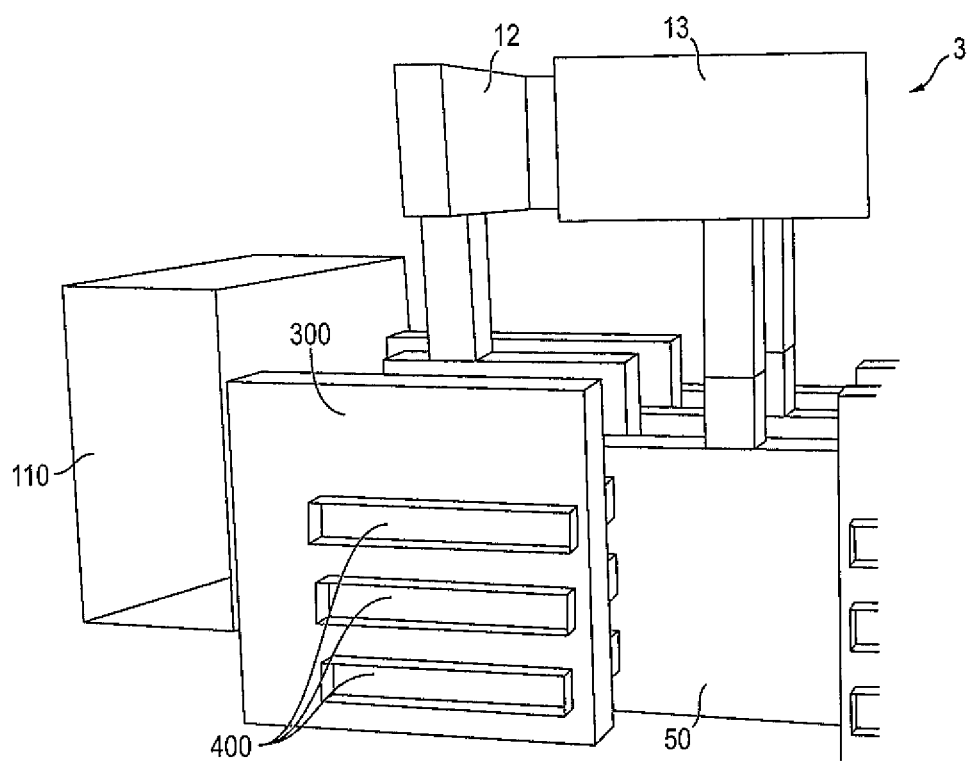
FIG. 3 is a perspective view of a portion of a standard cell according to another embodiment of the present invention.

FIG. 3 is a perspective view of a portion of a standard cell 3 according to another embodiment of the present invention. The standard cell 3 includes a power rail 110, contacts 300, the active layer 400 including the source/drain terminals, and the gate electrodes 50. Referring to FIG. 3, the power rail 110 and the contacts 300 are arranged at the same level as that of the active layer 400 and the gate electrodes 50. The height and/or depth of the power rail 110 can be modified independently (e.g., independently of the active layer 400) above the substrate to meet various desired IR drop target values. For example, as shown in FIG. 4, upper and lower surfaces of the power rail 120 can extend beyond upper and lower surfaces of the contact 300. However, even when the height of the power rail 110 is slightly different than the active layer 400 and the gate electrodes 50, the power rail 110 is still in the interconnection layer M0 and below the metal layer M1. For example, upper surface of the power rail 110 is below the metal layer M1 such that the area above the power rail 110 in the upper metal layers M1-Mx can be utilized for routing tracks.

Figure 5:
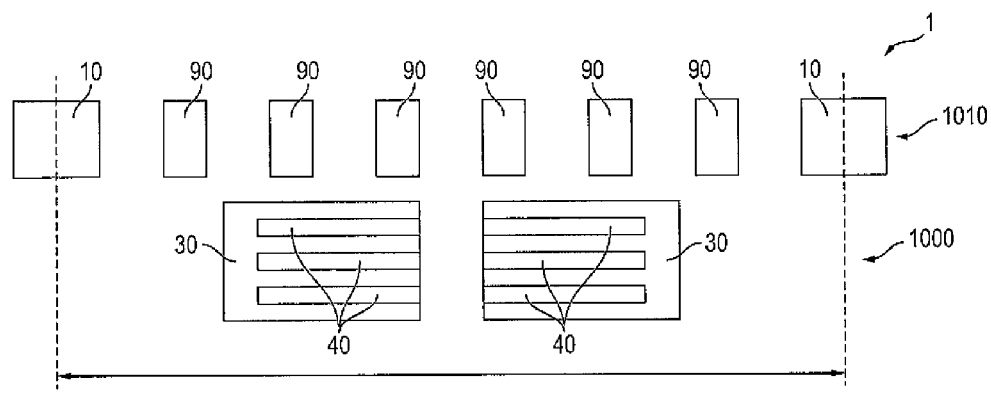
FIG. 5 is a schematic side view of aspects of the standard cell illustrated in FIG. 1.
Figure 6:
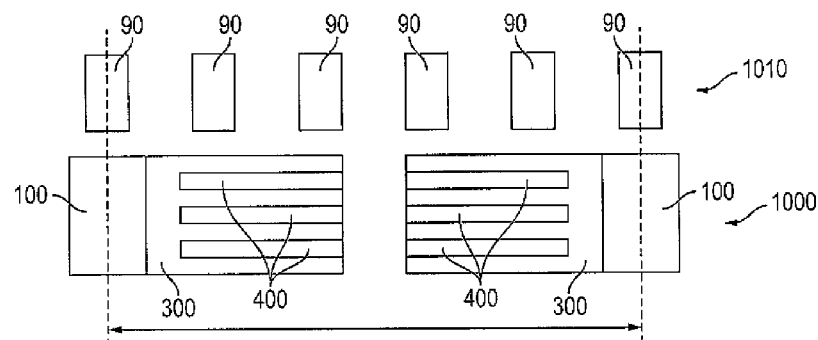
FIG. 6 is a schematic side view of aspects of a standard cell according to an embodiment of the present invention.

FIG. 6 is a schematic side view of aspects of a standard cell according to an embodiment of the present invention. In FIG. 6, routing tracks 90 are at the metal layer M1, indicated by 1010, and the power rail 100, the contacts 300, and the active layer 400 are at the interconnection layer M0, indicated by 1000. As can be seen in FIG. 6, because the power rail 100 is arranged in the interconnection layer M0 rather than the metal layer M1 (see 10 in FIG. 5), the overall size or footprint of the standard cell is reduced without reducing the number of the routing tracks 90.

Figure 7:
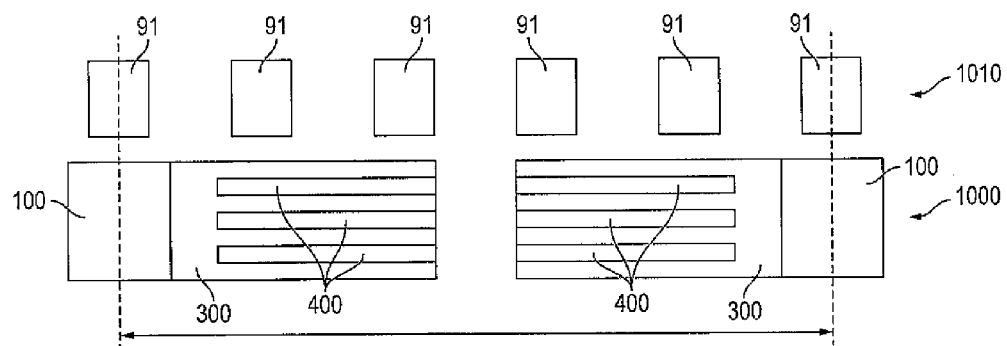
FIG. 7 is a schematic side view of aspects of a standard cell according to another embodiment of the present invention.

FIG. 7 is a schematic side view of aspects of a standard cell according to another embodiment of the present invention. Similar to FIG. 6, routing tracks 91 are at the metal layer M1, indicated by 1010, and the power rail 100, the contacts 300, and the active layer 400 are at the interconnection layer M0, indicated by 1000. In this embodiment, different from the embodiment of FIG. 6, the overall size or footprint of the standard cell is not reduced or is not substantially reduced compared to the standard cell 1 illustrated in FIG. 6, but the size of each of the routing tracks 91 is increased. For example, each of the routing tracks 91 is larger than the routing tracks 90 illustrated in FIGS. 5 and 6. As such, interconnections formed in the routing tracks 91 may be larger than interconnections formed in the routing tracks 90, thereby having reduced resistance and increasing the performance of the standard cell.

In yet another embodiment, additional routing tracks 90 can be included while staying within a footprint of the standard cell. For example, the space devoted to the power rails 10 in FIG. 5 can instead be where additional routing tracks 90 (see FIG. 6) are arranged without increasing the footprint of the standard cell.

In another embodiment, the routing tracks 90 can be spaced further apart from each other without increasing the footprint of the standard cell. For example, rather than increase the size of the routing tracks (see 91 in FIG. 7), the routing tracks 90 (see FIG. 6) can be spaced further apart (e.g., routing track pitch can be increased) without increasing the footprint of the standard cell. In this embodiment, the increased pitch between the routing tracks 90 provides reduced wiring capacitance generated by the insulating material present between adjacent ones of the routing tracks 90.

Furthermore, the present invention is not limited to the embodiments described above, and aspects of the various embodiments may be combined together in one embodiment. For example, in one embodiment, some of the routing tracks may have an increased size (see 91 in FIG. 7) while others of the routing tracks are spaced further apart. In another embodiment, the routing tracks on one metal layer may be larger than the routing tracks on another metal layer, or one metal layer may include larger routing tracks while another metal layer includes more routing tracks than the one metal layer.

Figure 13:
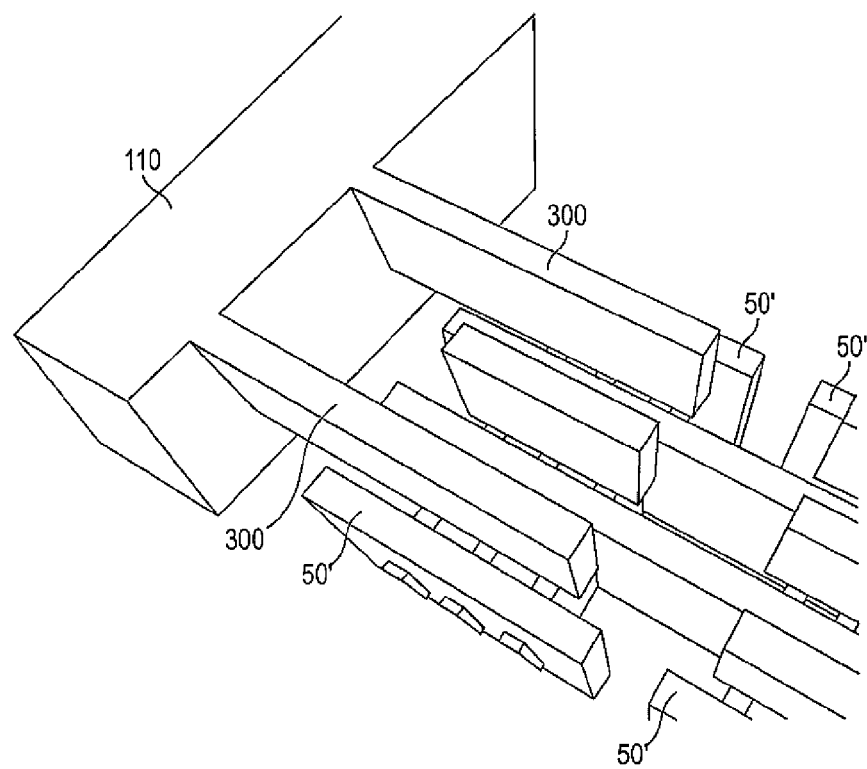
Figure 14:
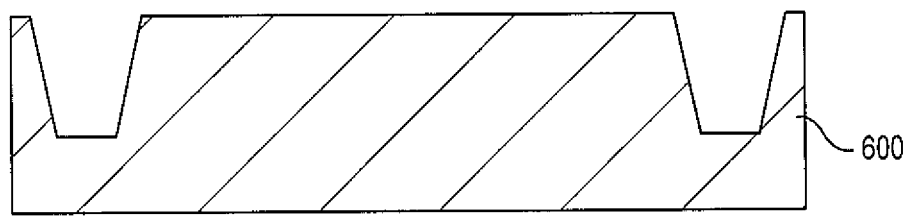

FIGS. 8-26 illustrate a method of manufacturing a standard cell according to an embodiment of the present invention. Referring to FIG. 14, a substrate 600 is patterned by, for example, using a pattern mask, to form a plurality of trenches (e.g., grooves) formed at cell separation boundaries. The trenches formed at the cell separation boundaries may be arranged in a repeating pattern along the substrate 600 to define areas at which standard cells will be formed.

Figure 15:
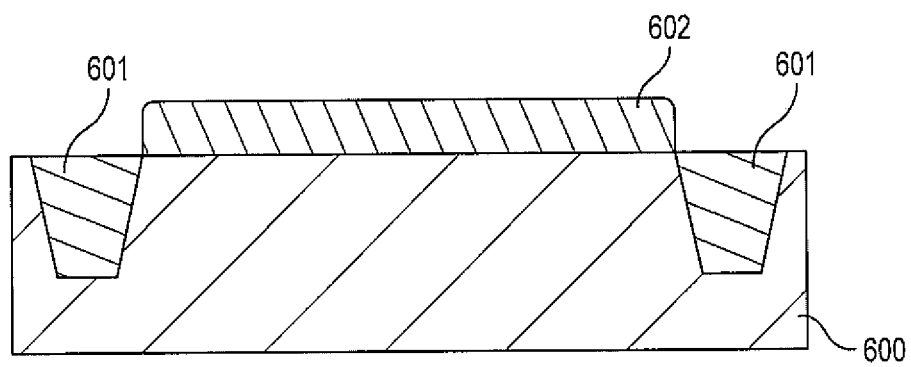

Referring to FIG. 15, the trenches formed at the cell separation boundaries may be filled with a conductive material 601 (e.g., an electrically insulating material). The conductive material 601 may be a metal, for example, tungsten (W), copper (Cu), or cobalt (Co). However, the conductive material 601 is not limited thereto. Further, an active epitaxial layer 602 is formed on an upper surface of the substrate 600 between the trenches formed at the cell separation boundaries. However, the present invention is not limited thereto, and the active epitaxial layer 602 may be formed over substantially the entire upper surface of the substrate 600. Then, portions of the active epitaxial layer 602 at the trenches formed at the cell separation boundaries may be removed. Also, an insulation layer, such as an oxide layer, and/or a silicon layer may be formed on the substrate 600 prior to the active epitaxial layer 602 being formed thereon.

Figure 16:
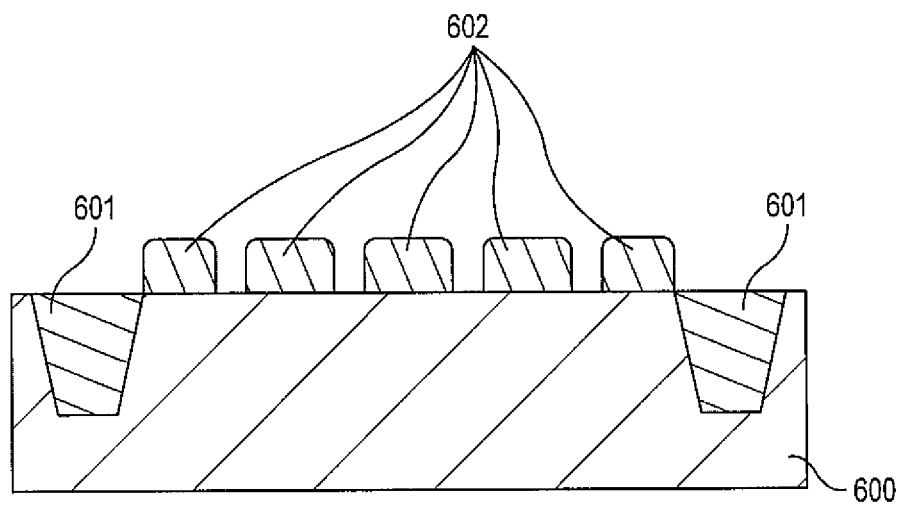

Referring to FIG. 16, the active epitaxial layer 602 is patterned or etched by, for example, using a pattern mask. For example, the active epitaxial layer 602 may be patterned such that portions thereof are removed, exposing the upper surface of the substrate 600 or, in other embodiments, the underlying insulation layer. The remaining portions of the active epitaxial layer 602 may variously form source and drain electrodes.

Figure 17:
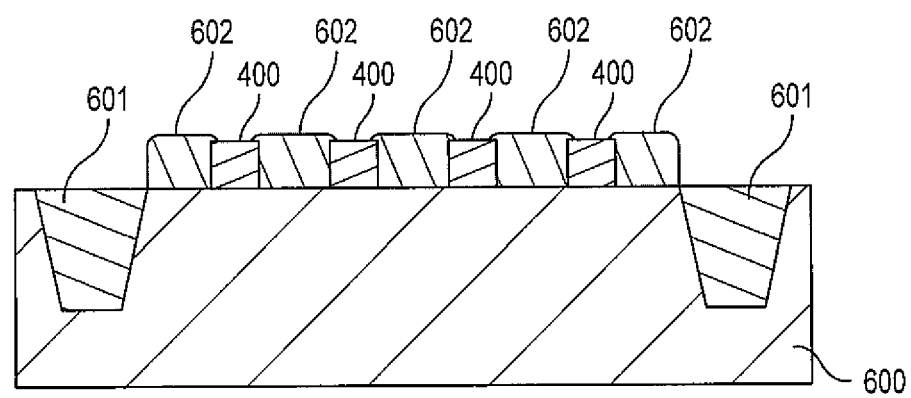

Referring to FIG. 17, an active layer 400 (e.g., fins or nanosheets) is formed between the remaining portions of the active epitaxial layer 602. Although the active layer 400 is illustrated as being a finFET, the present invention is not limited thereto. For example, aspects of the present invention can be applied to a nanosheet FET, such as a horizontal nanosheet FET.

Figure 18:
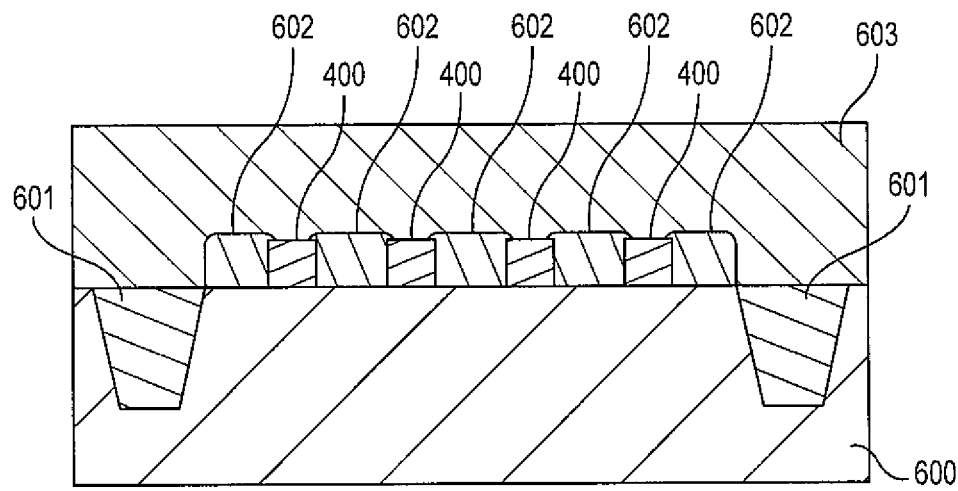
Figure 19:
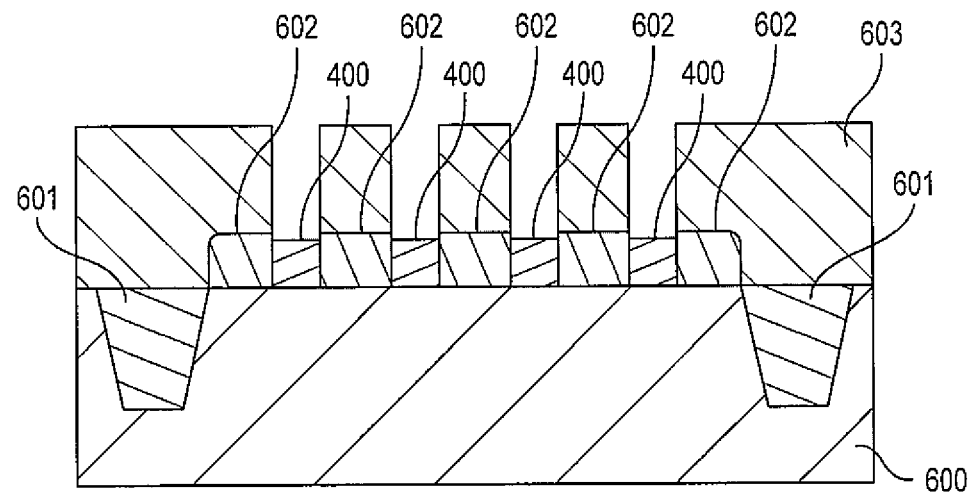

Referring to FIG. 18, a first insulating layer 603 (e.g., a first oxide layer) is formed over the substrate 600 and over the active epitaxial layer 602 and the active layer 400. Then, referring to FIG. 19, the first insulating layer 603 is patterned or etched by, for example, using a pattern mask. For example, portions of the first insulating layer 603 above the active layer 400 are patterned or etched, thereby exposing the active layer 400 through the first insulating layer 603.

Figure 8:
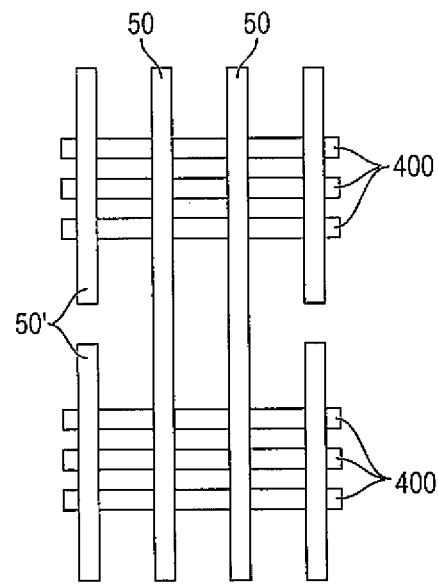
FIGS. 8-26 illustrate a method of manufacturing a standard cell according to an embodiment of the present invention.
Figure 9:
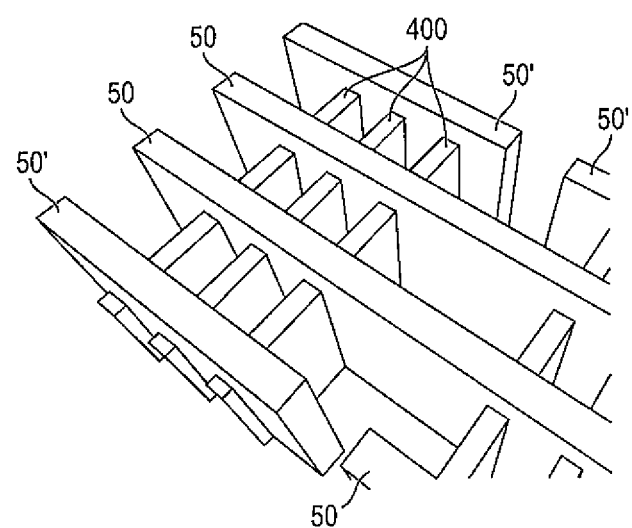
Figure 20:
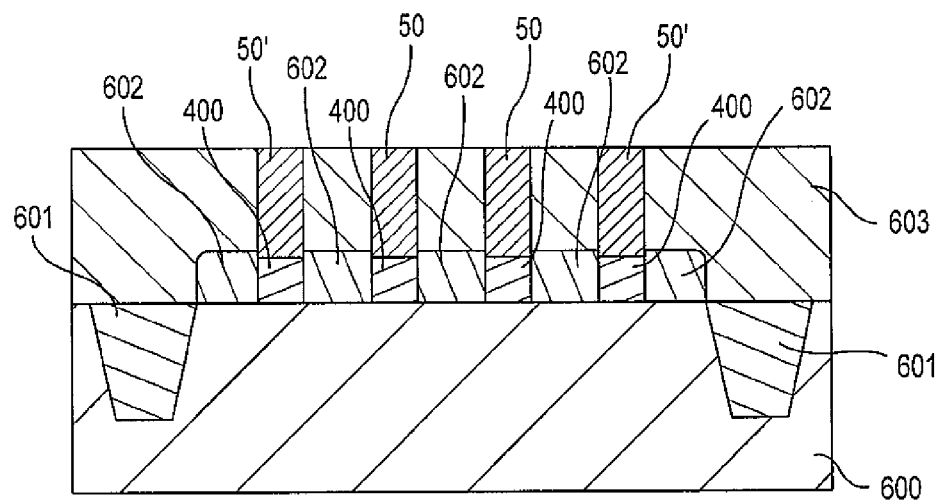

Referring to FIG. 20, active gate electrodes 50 and dummy gate electrodes 50' are formed in the openings in the first insulating layer 603. The gate electrodes 50 and 50' may be made of a metal. FIG. 8 shows a top planar view of the gate electrodes 50 and 50' and the active layer 400 of FIG. 20, and FIG. 9 shows a perspective view of the gate electrodes 50 and 50' and the active layer 400 of FIG. 20. The active epitaxial layer 602 is not illustrated in FIGS. 8-13 for clarity.

Figure 21:
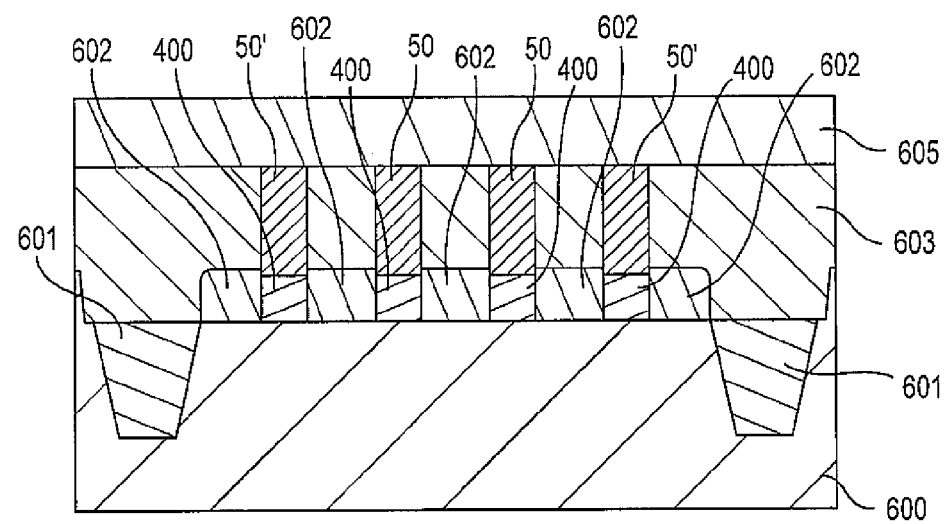
Figure 22:
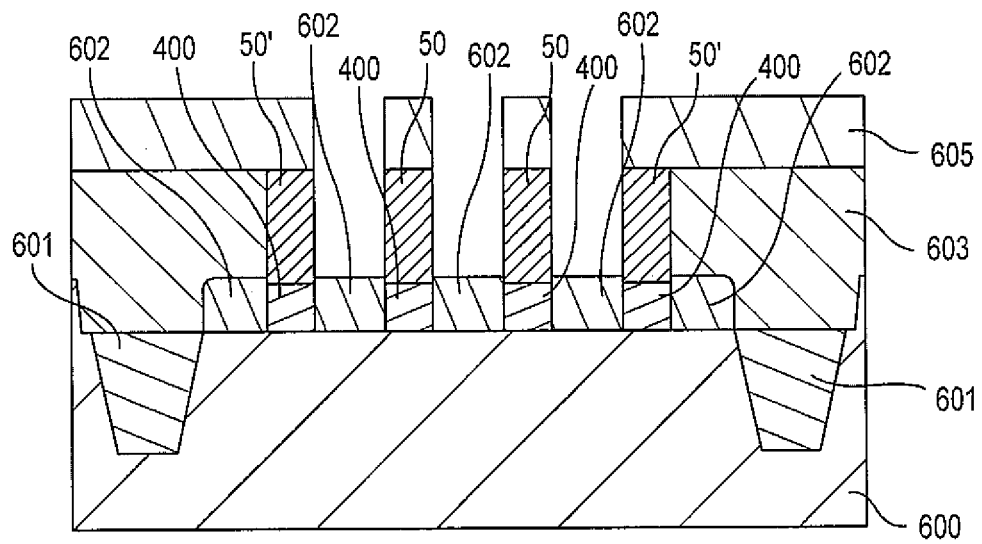

Referring to FIG. 21, a second insulating layer 605 (e.g., a second oxide layer) is formed over the first insulating layer 603 and the gate electrodes 50 and 50'. Then, referring to FIG. 22, the first insulating layer 603 and the second insulating layer 605 are patterned or etched by, for example, using a pattern mask, to remove portions thereof between adjacent ones of the gate electrodes 50 and 50'. The patterned areas of (e.g., the openings in) the first and second insulating layers 603 and 605 form local interconnect lines. Then, a cut mask is used to modify the local interconnect line length.

Figure 10:
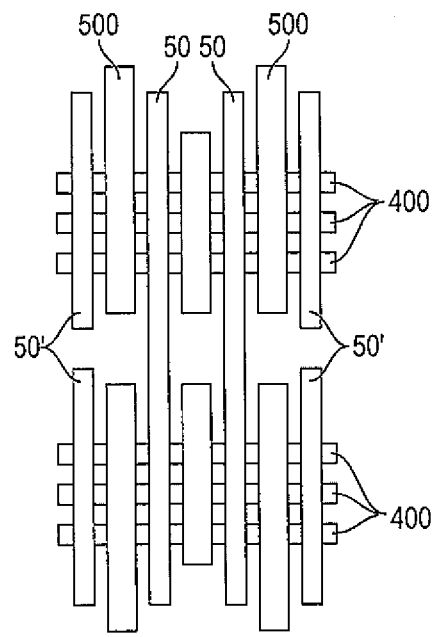
Figure 11:
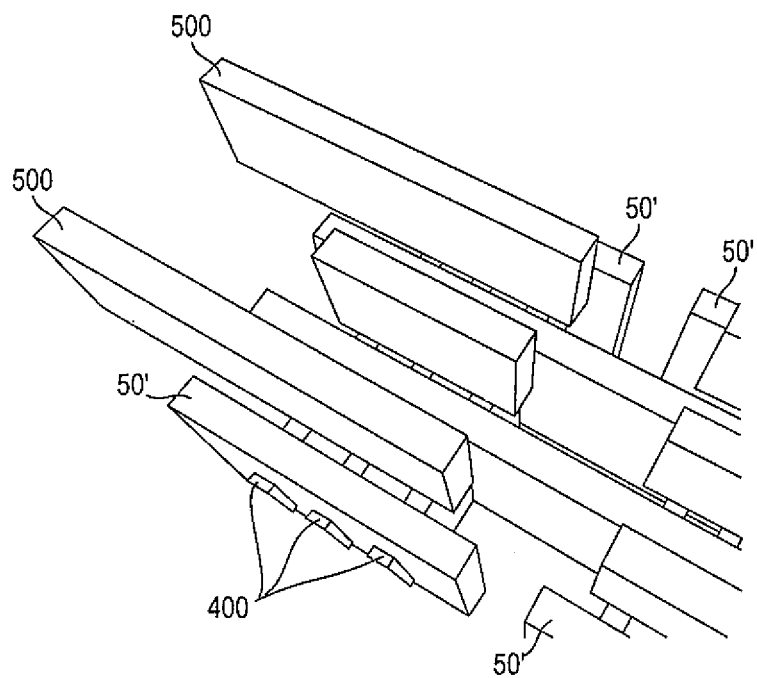
Figure 23:
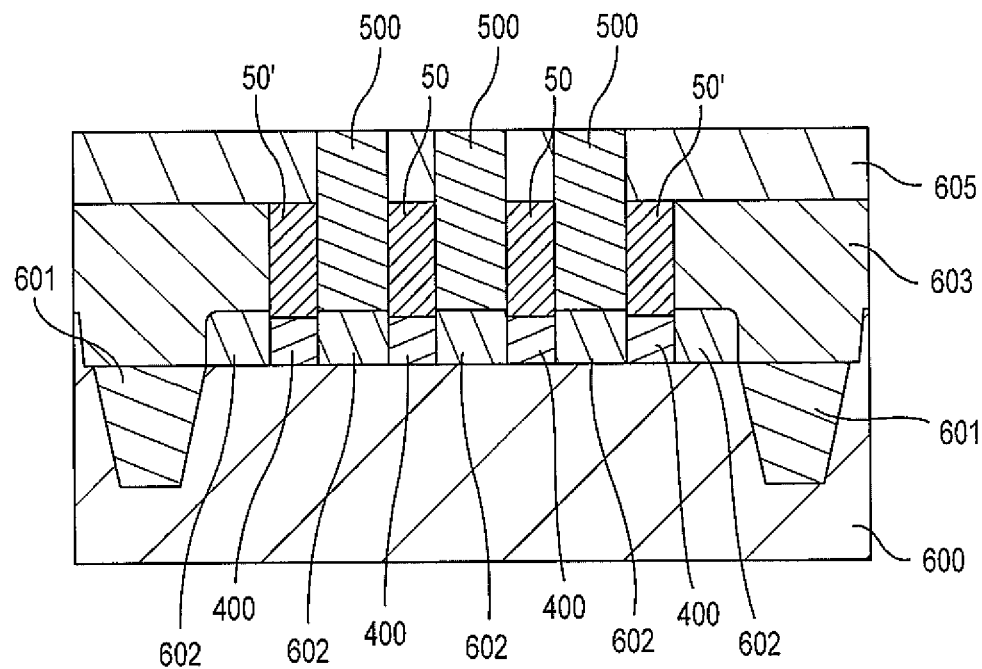
Figure 24:
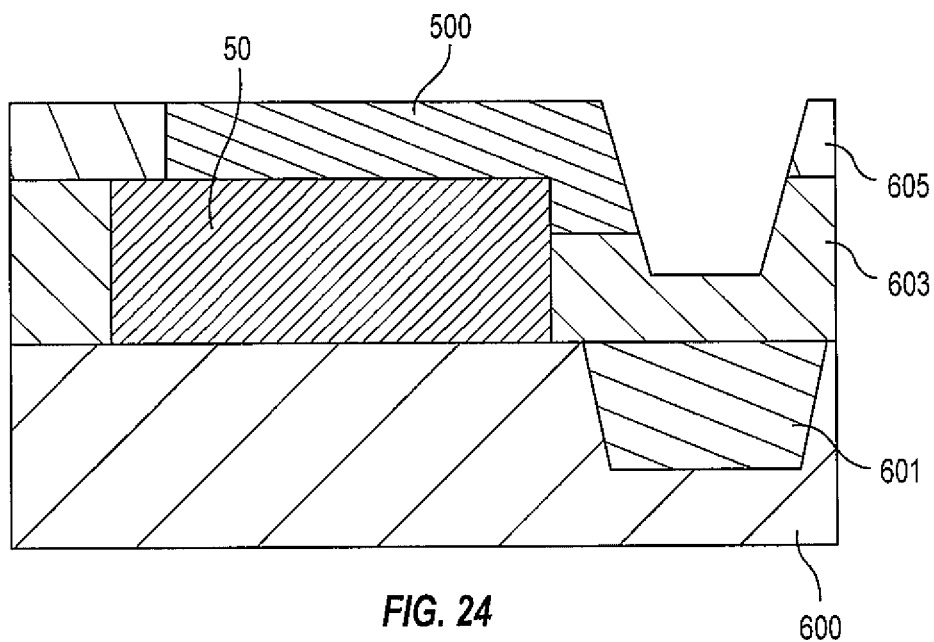

Referring to FIGS. 23 and 24, the local interconnect lines are filled with (e.g., are partially filled with) a sacrificial material 500. The sacrificial material may be, for example, a carbon (C) or a silicon-organic-hybrid (SOH) material. FIG. 10 shows a top planar view of the gate electrodes 50 and 50', the active layer 400, and the sacrificial material 500 of FIGS. 23 and 24, and FIG. 11 shows a perspective view of the gate electrodes 50 and 50', the active layer 400, and the sacrificial material 500 of FIGS. 23 and 24.

Figure 12:
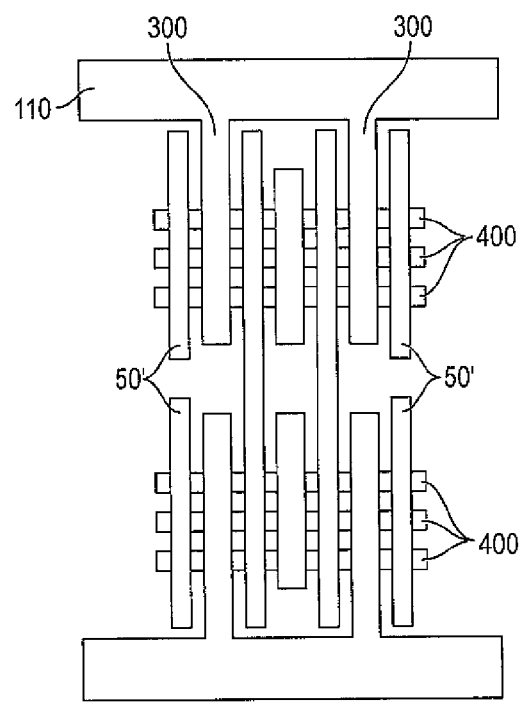
Figure 25:
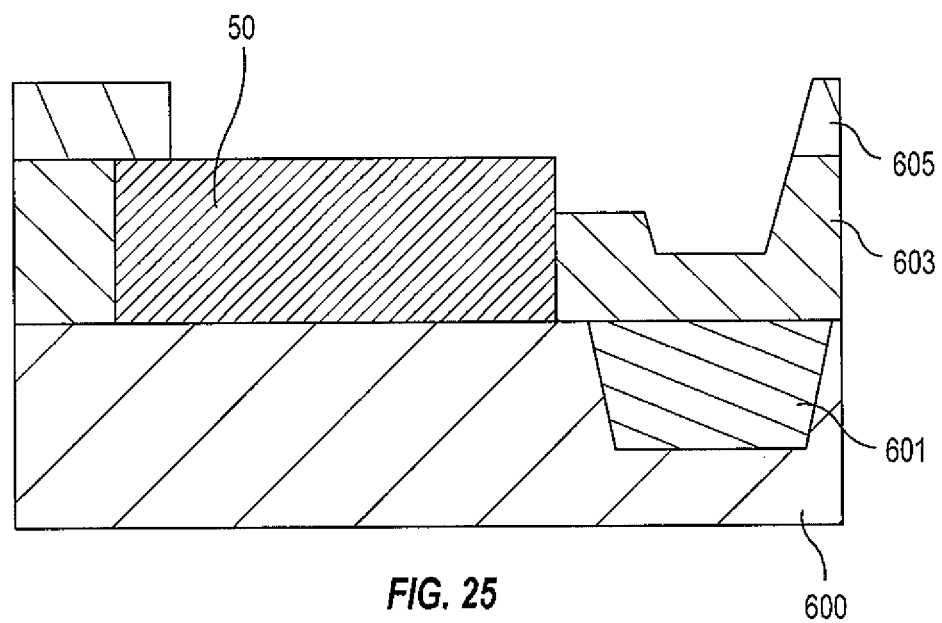
Figure 26:
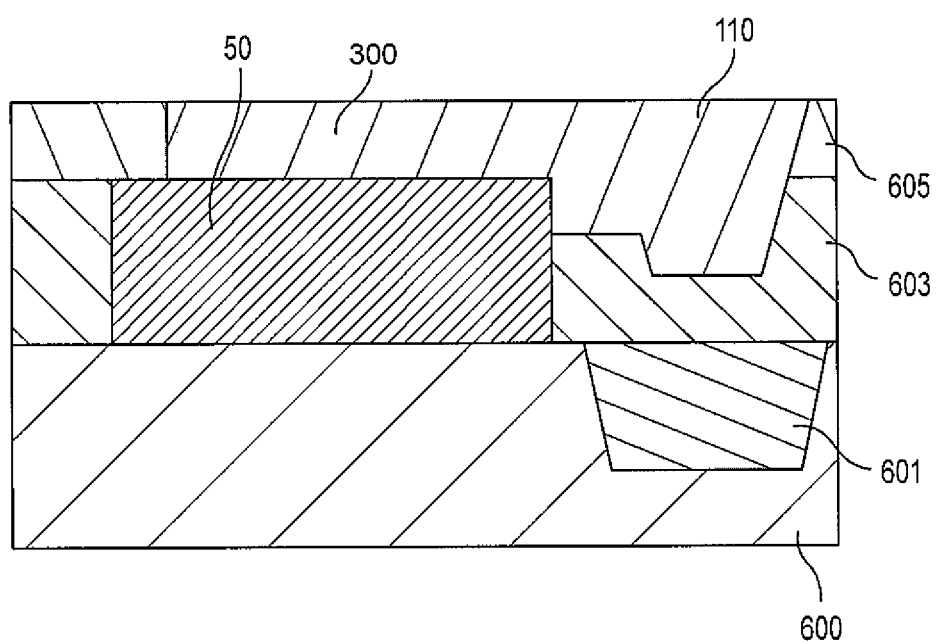

Then, referring to FIG. 25, the sacrificial material 500 is removed at the local interconnection lines. Referring to FIG. 26, a material, such as a metal, is filled in the local interconnection lines. The metal may be a low resistance contact metal, such as tungsten (W) or cobalt (Co). The metal material forms the power rail 110 and the contacts 300. As can be seen, the power rail 110 and the contacts 300 may be integrally formed. However, the present invention is not limited thereto, and the power rail 110 may be separately formed from and may be a different material than the contacts 300. FIG. 12 shows a top planar view of the gate electrodes 50 and 50', the active layer 400, the power rail 110, and the contacts 300 of FIG. 26, and FIG. 13 shows a perspective view of the gate electrodes 50 and 50', the active layer 400, the power rail 110, and the contacts 300 of FIG. 26.

FIGS. 8-26 illustrate a method of manufacturing a semiconductor device in which the power rail is slightly above the source/drain electrodes, such as the embodiment illustrated in FIG. 3. However, the method of manufacturing is not limited thereto, and the above-described method can be modified such that the power rail is substantially level with the source/drain electrodes, such as the embodiment illustrated in FIG. 2.

Although the present invention has been described with reference to the example embodiments, those skilled in the art will recognize that various changes and modifications to the described embodiments may be performed, all without departing from the spirit and scope of the present invention. Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims, and their equivalents.

What is claimed is:

1. A semiconductor device comprising:
a substrate;
a power rail on the substrate;
an active layer on the substrate and at same layer as the power rail, the active layer comprising source/drain terminals; and
a contact electrically connecting the power rail to the active layer.

2. The semiconductor device of claim 1, further comprising a gate electrode at the same layer as the power rail.

3. The semiconductor device of claim 2, wherein a bottom surface of the power rail is farther above the substrate than a bottom surface of the contact.

4. The semiconductor device of claim 3, wherein an upper surface of the power rail is above an upper surface of the contact.

5. The semiconductor device of claim 1, further comprising a plurality of metal layers, each of the metal layers comprising a plurality of interconnections,
wherein the power rail is arranged below the plurality of metal layers.

6. The semiconductor device of claim 5, wherein one of the interconnections in the metal layer nearest to the substrate is above the power rail in a direction perpendicular to an upper surface of the substrate.

7. The semiconductor device of claim 5, wherein at least one of the interconnections in each of the metal layers extends over the power rail in a direction parallel to an upper surface of the substrate.

8. The semiconductor device of claim 1, wherein the contact and the power rail are integrally formed.

9. The semiconductor device of claim 1, wherein a bottom surface of the power rail is a same distance above the substrate as a bottom surface of the contact.

10. The semiconductor device of claim 9, wherein the power rail comprises a low resistance metal.

11. A semiconductor device comprising:
a substrate;
a power rail on the substrate;
an active layer on the substrate and comprising source/drain terminals, a same number of layers being between the substrate and the power rail as between the substrate and the active layer; and
a contact electrically connecting the power rail to the active layer.

12. The semiconductor device of claim 11, further comprising a plurality of gate electrodes in the same layer as the power rail.

13. The semiconductor device of claim 12, wherein a bottom surface of the power rail is farther from the substrate than a bottom surface of the contact.

14. The semiconductor device of claim 11, further comprising a plurality of metal layers above the power rail, each of the metal layers comprising a plurality of interconnections.

15. The semiconductor device of claim 14, wherein at least one of the interconnections in a first one of the metal layers above the power rail extends over the power rail in a direction perpendicular to an upper surface of the substrate.

16. The semiconductor device of claim 14, wherein at least one interconnection in each of the metal layers extends over the power rail in a direction perpendicular to an upper surface of the substrate.

17. The semiconductor device of claim 14, wherein an imaginary line extending perpendicular to an upper surface of the substrate extends through the power rail and at least one interconnection in a first one of the metal layers above the power rail.

18. A method of manufacturing a semiconductor device, the method comprising:
   forming an active layer on a substrate;
   forming a plurality of contacts on the substrate, the contacts being electrically connected to the active layer; and
   forming a power rail on the substrate, the power rail being electrically coupled to the active layer by the contacts, and the power rail being at a same level as the contacts.

19. The method of claim 18, further comprising forming an insulating layer on the active layer;
   forming a first trench in the insulating layer to define a first area; and
   forming a second trench in the insulating layer to define a second area,
   wherein the forming of the power rail and forming the contacts comprises filling both the first and second areas in the insulating layer with a conductive material.

20. The method of claim 19, further comprising patterning the substrate to form a trench at a cell separation boundary, and
   wherein the forming of the power rail comprises forming the power rail over the trench at the cell separation boundary.

* * * * *